United States Patent
Watanabe

(10) Patent No.: US 11,770,927 B2
(45) Date of Patent: Sep. 26, 2023

(54) SEMICONDUCTOR STORAGE DEVICE

(71) Applicant: Kioxia Corporation, Tokyo (JP)

(72) Inventor: Kenji Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 278 days.

(21) Appl. No.: 17/194,385

(22) Filed: Mar. 8, 2021

(65) Prior Publication Data

US 2022/0045076 A1 Feb. 10, 2022

(30) Foreign Application Priority Data

Aug. 7, 2020 (JP) .................................. 2020-135031

(51) Int. Cl.
| | |
|---|---|
| H10B 41/27 | (2023.01) |
| H10B 43/27 | (2023.01) |
| H01L 23/522 | (2006.01) |
| G11C 5/06 | (2006.01) |

(52) U.S. Cl.
CPC ............... *H10B 41/27* (2023.02); *G11C 5/06* (2013.01); *H01L 23/5226* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 6,483,192 B1 | 11/2002 | Kobayashi | |
| 2016/0276262 A1* | 9/2016 | Ishimura | ........... H01L 21/76805 |
| 2018/0337191 A1* | 11/2018 | Lai | ....................... H01L 27/1157 |
| 2020/0006379 A1 | 1/2020 | Nishikawa et al. | |

FOREIGN PATENT DOCUMENTS

| | | |
|---|---|---|
| JP | 05-206291 A | 8/1993 |
| JP | 2011-007745 A | 1/2011 |

* cited by examiner

*Primary Examiner* — Sarah K Salerno
(74) *Attorney, Agent, or Firm* — Oblon, McClelland, Maier & Neustadt, L.L.P.

(57) ABSTRACT

According to one embodiment, a semiconductor storage device includes: a stacked body in which a plurality of conductive layers are separated from each other and are stacked; a pillar which extends in a stacking direction and includes memory cells to be formed at intersections with at least some of the plurality of conductive layers; an upper insulating layer arranged on the stacked body; a plug which extends in the stacking direction inside the upper insulating layer and is connected to the upper end portion of the pillar; and a spacer insulating layer which surrounds the plug and has a lower dielectric constant than a dielectric constant of the upper insulating layer.

19 Claims, 9 Drawing Sheets

SEMICONDUCTOR STORAGE DEVICE

CROSS-REFERENCE TO RELATED APPLICATIONS

This application is based upon and claims the benefit of priority from Japanese Patent Application No. 2020-135031, filed on Aug. 7, 2020; the entire contents of which are incorporated herein by reference.

FIELD

Embodiments described herein relate generally to a semiconductor storage device.

BACKGROUND

In a three-dimensional non-volatile memory, for example, a pillar penetrates through a stacked body in which a plurality of conductive layers are stacked, and memory cells are formed at intersections between the pillar and at least some of the conductive layers. A plug connecting the pillar and an upper layer wiring is connected to an upper surface of the pillar. If the pillar and the plug both having a columnar shape are misaligned, for example, there is a possibility that the plug and the conductive layer in the stacked body come into contact with each other.

DETAILED DESCRIPTION

A semiconductor storage device of an embodiment includes: a stacked body in which a plurality of conductive layers are separated from each other and are stacked; a pillar which extends in a stacking direction of the plurality of conductive layers inside the stacked body and includes memory cells to be formed at intersections with at least some of the plurality of conductive layers; an upper insulating layer arranged on the stacked body; a plug which extends in the stacking direction inside the upper insulating layer and is connected to an upper end portion of the pillar; and a spacer insulating layer which surrounds the plug inside the upper insulating layer and has a lower dielectric constant than a dielectric constant of the upper insulating layer.

Hereinafter, the present invention will be described in detail with reference to the drawings. Note that the present invention is not limited to the following embodiments. In addition, constituent elements in the following embodiments include those that can be easily assumed by those skilled in the art or those that are substantially the same.

(Configuration Example of Semiconductor Storage Device)

Figure 1A:
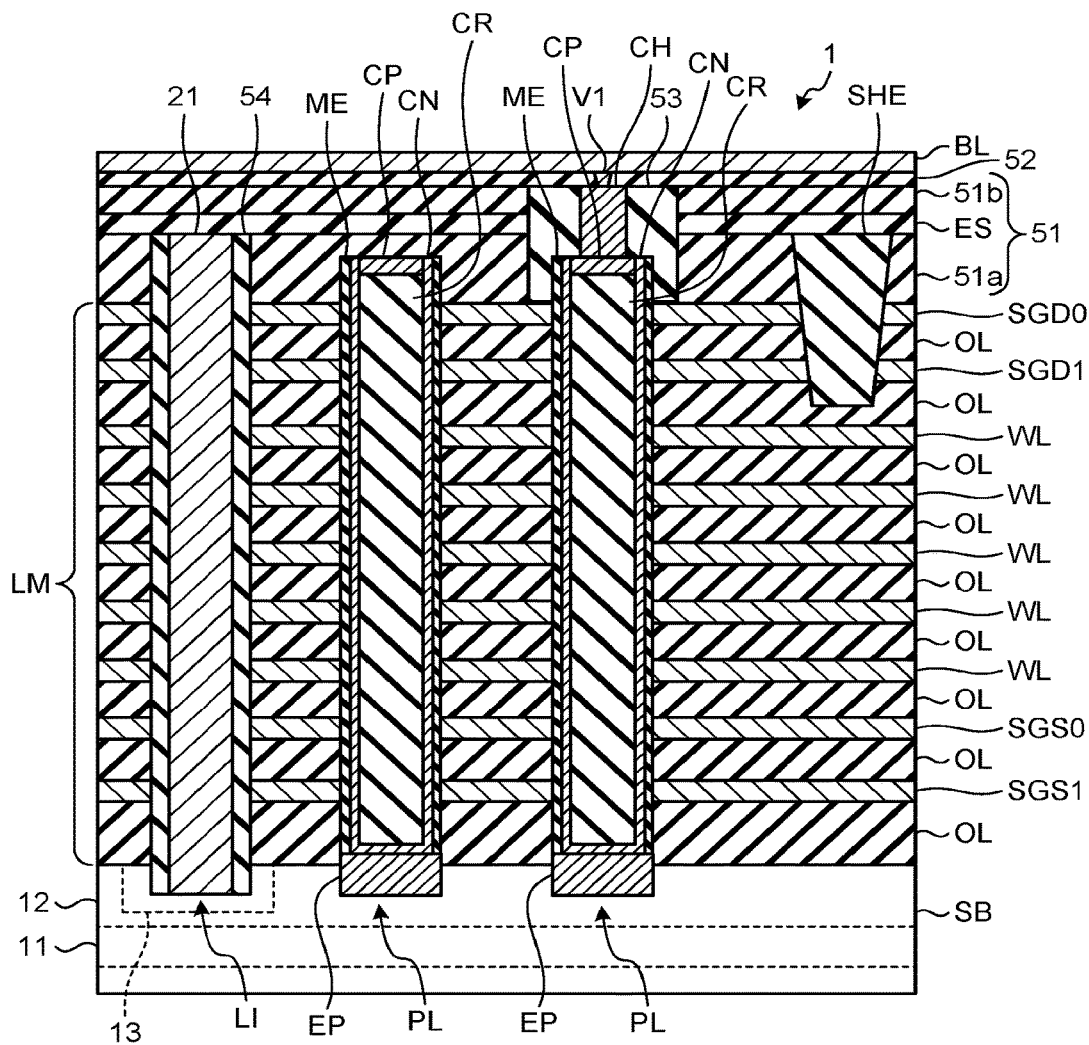
FIGS. 1A to 1D are cross-sectional views of a semiconductor storage device according to an embodiment.
Figure 1B:
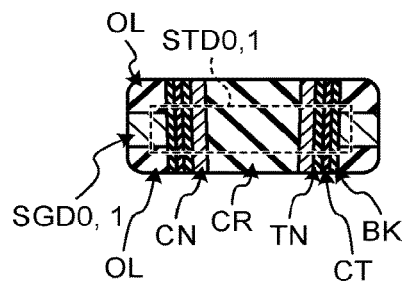
Figure 1C:
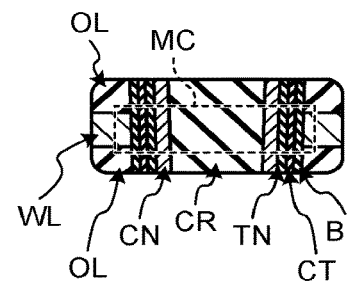
Figure 1D:
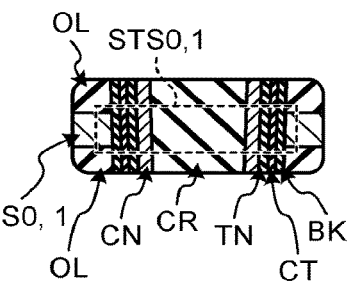

FIGS. 1A to 1D are cross-sectional views of a semiconductor storage device 1 according to an embodiment. FIG. 1A is a cross-sectional view illustrating the overall configuration of a pillar PL of the semiconductor storage device 1. FIG. 1B is an enlarged cross-sectional view of the pillar PL in the vicinity of select gate lines SGD0 and SGD1, FIG. 1C is an enlarged cross-sectional view of the pillar PL in the vicinity of the word line WL, and FIG. 1D is an enlarged cross-sectional view of the pillar PL in the vicinity of the select gate lines SGS0 and SGS1.

As illustrated in FIG. 1A, the semiconductor storage device 1 includes a stacked body LM, insulating layers 51, 52, and the like on a substrate SB.

The substrate SB is a semiconductor substrate such as a silicon substrate. The substrate SB has an n well 11 in a surface layer portion, a p well 12 inside the n well 11, and a plurality of $n^+$ diffusion regions 13 inside the p well 12.

The stacked body LM has a structure in which a plurality of conductive layers and insulating layers are alternately stacked one by one. The conductive layer is, for example, a tungsten layer or a molybdenum layer. The insulating layer is, for example, an $SiO_2$ layer or the like.

Among the plurality of conductive layers of the stacked body LM, conductive layers on the lowermost layer and the second lowermost layer are the select gate lines SGS1 and SGS0, respectively. Among the plurality of conductive layers, conductive layers on the second uppermost layer and the uppermost layer are the select gate lines SGD1 and SGD0, respectively. The other conductive layers of the stacked body LM are the word lines WL.

However, the number of the select gates line SGS is arbitrary, and the number of the select gate lines SGS may be one or less or three or more. In addition, the number of the select gate lines SGD is arbitrary, and the number of the select gate lines SGD may be one or less or three or more. The number of the word lines WL is also arbitrary.

In this manner, the plurality of conductive layers of the stacked body LM may include a predetermined number of the select gate lines SGS and SGD and a predetermined number of the word lines WL. It is noted that the select gate lines SGS and SGD and the word line WL may be configured using different conductive materials.

The plurality of word lines WL and the select gate lines SGS1, SGS0, SGD1, and SGD0 are separated from each other, and an insulating layer OL is arranged among the plurality of word lines WL and the select gate lines SGS1, SGS0, SGD1, and SGD0.

Insulating layers 51*a* and 51*b* as the upper insulating layer 51 are arranged on the stacked body LM, and an etching stopper layer ES as an intermediate insulating layer of the upper insulating layer 51 is inserted between the insulating layers 51*a* and 51*b*. That is, in the upper insulating layer 51, the etching stopper layer ES as the intermediate insulating layer is made of a different material from the other parts of the upper insulating layer 51. Here, the other parts of the upper insulating layer 51 are, for example, the insulating layers 51*a* and 51*b*. A bit line BL as an upper layer wiring is arranged on the insulating layer 51*b* with the insulating layer 52 interposed therebetween.

The insulating layers 51*a*, 51*b*, and 52 are, for example, $SiO_2$ layers or the like. The etching stopper layer ES is, for example, an SiN layer or the like, and has a higher etching resistance than the insulating layers 51*a* and 51*b* under a predetermined etching condition. In addition, the etching stopper layer ES is a layer having a higher dielectric constant than, for example, those of the insulating layers 51*a* and 51*b*. The bit line BL is a metal layer or the like.

In the stacked body LM, a plurality of contacts LI each of which has a longitudinal direction in a predetermined direction along the surface of each layer of the stacked body LM, penetrates the insulating layer 51*a* and the stacked body LM, and reaches the $n^+$ diffusion region 13 of the substrate SB are arranged. The stacked body LM is divided into a plurality of portions by the plurality of contacts LI in a direction intersecting the predetermined direction.

An insulating layer 54 such as an $SiO_2$ layer is arranged on a side wall of the contact LI. The inside of the insulating layer 54 is filled with a conductive layer 21 such as a tungsten layer. The conductive layer 21 of the contact LI is connected to the upper layer wiring by a plug or the like (not illustrated).

With the above configuration, the contact LI functions as, for example, a source line contact. However, instead of the contact LI, an insulating layer or the like that does not function as the source line contact may divide the stacked body LM.

A separation layer SHE, which has a longitudinal direction in a direction along the longitudinal direction of the contact LI and penetrates the insulating layer 51*a* and the select gate lines SGD0 and SGD1 of the stacked body LM, is arranged between the two contacts LI. The separation layer SHE is filled with an insulating layer such as an $SiO_2$ layer, and partitions the conductive layers on the uppermost layer and the second uppermost layer of the stacked body LM into patterns of the two select gate lines SGD0 and SGD1, respectively, between the two contacts LI.

In addition, between the two contacts LI, a plurality of the pillars PL extending in the stacking direction of the plurality of word lines WL inside the stacked body LM are arranged in a matrix, for example, to be separated from each other by a predetermined distance. The stacking direction of the plurality of word lines WL is a direction intersecting a direction in which the individual word lines WL extend and spread in layers. Note that the direction in which the word lines WL extend and spread in layers substantially coincides with a direction in which the insulating layers OL included in the stacked body LM extend and spread in layers. Therefore, the stacking direction of the plurality of word lines WL may be simply referred to as a stacking direction of the stacked body LM in the present specification.

The pillar PL penetrates the stacked body LM from a predetermined depth position of the insulating layer 51*a* and reaches the inside of the p well 12 of the substrate SB. The pillar PL has a columnar shape whose cross section orthogonal to a longitudinal direction of the pillar PL is, for example, a circle.

The pillar PL includes an epitaxial layer EP protruding from the inside of the p well 12 of the substrate SB into the insulating layer OL on the lowermost layer of the stacked body LM at a lower end portion. The epitaxial layer EP is, for example, a crystalline silicon layer or the like.

On the epitaxial layer EP in the pillar PL, a memory layer ME, a channel layer CN, and a core layer CR are arranged in order from an outer peripheral portion of the pillar PL so as to penetrate the stacked body LM. The memory layer ME is a layer in which a block insulating layer BK, a charge storage layer CT, and a tunnel insulating layer TN are stacked in this order from the outer peripheral side of the pillar PL. The channel layer CN is also arranged on an upper surface of the epitaxial layer EP.

The block insulating layer BK, the tunnel insulating layer TN, and the core layer CR are, for example, $SiO_2$ layers or the like. The charge storage layer CT is, for example, an SiN layer or the like. The channel layer CN is, for example, an amorphous silicon layer or a polysilicon layer.

A cap layer CP, which is an amorphous silicon layer or a polysilicon layer, is arranged at an upper end portion of the core layer CR and is connected to the channel layer CN on the outer periphery. The cap layer CP is connected to a plug CH that penetrates the etching stopper layer ES and extends in a vertical direction inside the insulating layers 51*a* and 51*b*. The plug CH is connected to the bit line BL via a plug V1 embedded in the insulating layer 52 arranged on the insulating layer 51*b*.

Note that the vertical direction of the semiconductor storage device 1 is defined with the pillar PL as a reference in the present specification. Specifically, one of both end portions in the longitudinal direction of the pillar PL to which the plug CH is connected is referred to as an upward direction of the semiconductor storage device 1. In the present specification, the vertical direction of the semiconductor storage device 1 is sometimes used as the same meaning with the stacking direction of the plurality of word lines WL described above.

The plug CH has a columnar shape whose cross section orthogonal to the longitudinal direction of the plug CH is circular, and is configured to be filled with a metal layer such as a tungsten layer. A diameter of the plug CH is smaller than a diameter of the pillar PL, for example. That is, the plug CH has the area smaller than the area of the upper end portion of the pillar PL when viewed from the stacking direction of the stacked body LM. The plug V1 has, for example, an elliptical cross section orthogonal to the longitudinal direction of the plug V1, and is configured to be filled with a metal layer such as a tungsten layer.

Note that it is possible to prevent the plug CH connected to one pillar PL from coming too close to the adjacent pillar PL and coming into physical or electrical contact therewith since the plurality of pillars PL are separated from each other by the predetermined distance as described above. In other words, an interval between the plurality of pillars PL is maintained at the distance, for example, which can prevent the physical and electrical contact between the adjacent plug CHs and pillar PL.

An insulating layer 53 serving as a spacer insulating layer is arranged around the plug CH. The insulating layer 53 surrounds the plug CH with a predetermined thickness, and is interposed between the plug CH and the upper insulating layer 51 including the insulating layers 51*a* and 51*b* and the etching stopper layer ES. A diameter of an outer edge of the insulating layer 53 is larger than, for example, a diameter of the pillar PL.

The insulating layer 53 extends inside the insulating layer 51a to a position below an upper surface of the pillar PL. A lower end of the insulating layer 53 may reach, for example, an upper surface of the select gate line SGD0 to come into contact with the select gate line SGD0. As a result, the insulating layer 53 covers at least a part of an outer peripheral part of the upper end portion of the pillar PL protruding into the insulating layer 51a.

The insulating layer 53 is a layer having a lower dielectric constant than those of the insulating layers 51a and 51b, and is, for example, a low dielectric constant layer (low-k layer) containing SiOC or the like. Since the etching stopper layer ES is the layer having a higher dielectric constant than, for example, those of the insulating layers 51a and 51b as described above, it can also be said that the insulating layer 53 generally has a lower dielectric constant than that of the upper insulating layer 51.

Note that the insulating layer 53 may be a low-k layer containing a material other than SiOC. For example, as the insulating layer 53, it is possible to use a low-k layer containing at least any low-k material such as SiOC, SiOF, SiOCN, SiCOH, SiBCN, hydrogen-containing SiO (HSQ: Hydrogen Silses-Quioxane), and methyl group-containing SiO (MSQ: Methyl Silses-Quioxane). The insulating layer 53 may contain a low-k material other than these. The insulating layer 53 may contain one or more materials, or may be constituted by a plurality of sub-layers at least one of which contains a low-k material. One or more of the materials contained in the low-k layer may be porous.

Here, there is a case where the pillar PL is also arranged at an arrangement position of the separation layer SHE in order to maintain a regular array of the plurality of pillars PL. In this case, an upper portion of the pillar PL interferes with the separation layer SHE, and the plugs CH and V1 and the like are not arranged on such a pillar PL. Accordingly, such a pillar PL can be used as a dummy pillar in which an effective memory cell for reading and writing data is not formed even at the intersection with the word line WL.

As illustrated in FIG. 1C, a plurality of memory cells MC, arranged in a height direction, are formed at the intersections of the pillars PL connected to the bit line BL via the plugs CH and V1, and the respective word lines WL. That is, when assuming that the plurality of conductive layers include the select gate lines SGS and SGD and the word lines WL, the memory cells MC are formed at the intersections with the plurality of word lines WL which are some of the plurality of conductive layers.

As a predetermined charge is stored and so on in the charge storage layer CT of the memory cell MC, data is held in each of the memory cells MC. As a predetermined voltage such as a read voltage and a write voltage is applied through each of the word lines WL arranged at the same height position as each of the memory cells MC, data is read and written from and to each of the memory cells MC.

As illustrated in FIG. 1B, select gates STD0 and STD1 are formed at intersections between the pillar PL, and each of the select gate lines SGD0 and SGD1, respectively. In addition, select gates STS0 and STS1 are formed at intersections between the pillar PL and each of the select gate lines SGS0 and SGS1, respectively, as illustrated in FIG. 1D. As a predetermined voltage is applied through the select gate lines SGD0, SGD1, SGS0, and SGS1, the select gates STD0, STD1, STS0, and STS1 are turn on or off, and the memory cells MC of the pillars PL to which those select gates STD0, STD1, STS0, and STS1 belong are turned into a selected state or an unselected state.

The stacked body LM includes, for example, a stepped region (not illustrated) in which the plurality of word lines WL and the select gate lines SGD0, SGD1, SGS0, and SGS1 are led out in a staircase shape. The individual word lines WL and the select gate lines SGD0, SGD1, SGS0, and SGS1 in the stepped region are connected to a peripheral circuit (not illustrated).

The peripheral circuit includes, for example, a transistor (not illustrated) arranged on the substrate SB, is arranged around the stacked body LM, and contributes to operations of the memory cell MC and the select gates STD0, STD1, STS0, and STS1 by controlling the voltage to be applied to the word line WL and the select gate lines SGD0, SGD1, SGS0, and SGS1.

(Method for Manufacturing Semiconductor Storage Device)

Next, an example of a method for manufacturing the semiconductor storage device 1 according to the embodiment will be described with reference to FIGS. 2A to 7D. FIGS. 2A to 3D are cross-sectional views illustrating an example of a procedure of the method for manufacturing the semiconductor storage device 1 according to the embodiment. Note that it is assumed that the peripheral circuit (not illustrated) has already been formed on the substrate SB before the processing illustrated in FIG. 2A.

Figure 2A:
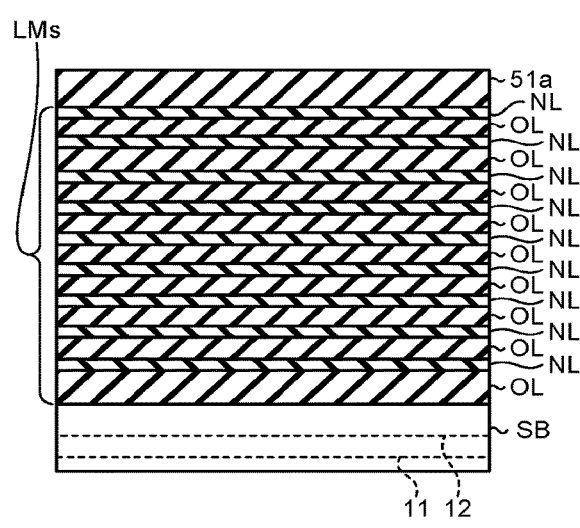
FIGS. 2A to 2D are cross-sectional views illustrating an example of a procedure of a method for manufacturing the semiconductor storage device according to the embodiment.

As illustrated in FIG. 2A, a stacked body LMs in which a plurality of sacrificial layers NL and insulating layers OL are alternately stacked one by one is formed on the substrate SB which has the n well 11 in a surface layer portion and has the p well 12 in the n well 11. The sacrificial layer NL is, for example, an SiN layer or the like, and is the layer that is to be replaced later with a conductive material to form the word line WL or the select gate lines SGD1, SGD0, SGS1, and SGS0. The insulating layer 51a is formed on the stacked body LMs.

In addition, at this timing, a stepped region (not illustrated) is formed in which the individual sacrificial layers NL of the stacked body LMs are led out in a staircase shape.

Figure 2B:
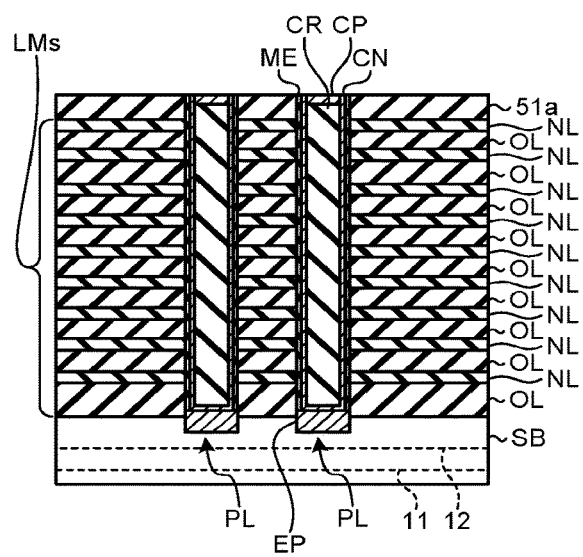

As illustrated in FIG. 2B, the plurality of pillars PL which penetrate the insulating layer 51a and the stacked body LMs and reach the p well 12 of the substrate SB are formed.

That is, a plurality of memory holes which penetrate the insulating layer 51a and the stacked body LMs and reach the p well 12 of the substrate SB are formed, and crystalline silicon compatible with silicon constituting the substrate SB, for example, are epitaxially grown at a hole bottom of the memory hole to form the epitaxial layer EP. In addition, the memory layer ME, the channel layer CN, and the core layer are formed in the memory hole in this order from the outer peripheral side of the memory hole. The channel layer CN is also formed on the epitaxial layer EP at the bottom of the memory hole. In addition, a concave portion formed by etching back an upper end portion of the core layer CR is filled with an amorphous silicon layer, a polysilicon layer, or the like to form the cap layer CP.

As a result, the plurality of pillars PL arranged in a matrix are formed in the stacked body LMs.

Figure 2C:
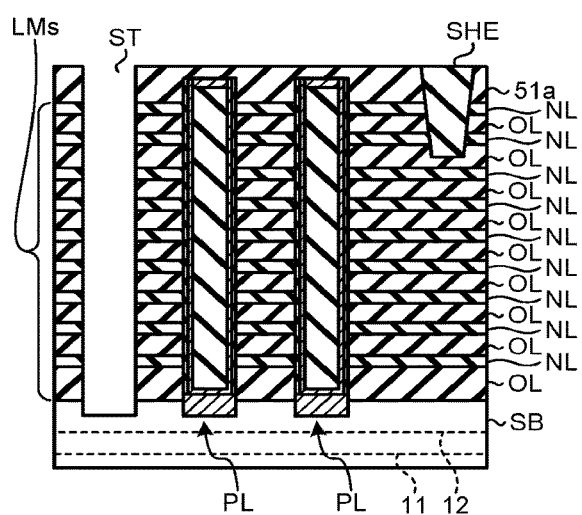

As illustrated in FIG. 2C, the insulating layer 51a is stacked up to bury the upper surface of the pillar PL in the insulating layer 51a. In addition, a plurality of slits ST each of which has a longitudinal direction in a predetermined direction along a surface of each layer of the stacked body LMs, penetrates the insulating layer 51a and the stacked body LMs, and reaches the p well 12 of the substrate SB are formed. In addition, a groove, which has a longitudinal direction along the longitudinal direction of the slit ST and penetrates the insulating layer 51a and the sacrificial layers NL on the uppermost layer and the second uppermost layer of the stacked body LMs, is formed at a position between the two slits ST, and the groove is filled with an insulating layer to form the separation layer SHE.

Figure 2D:
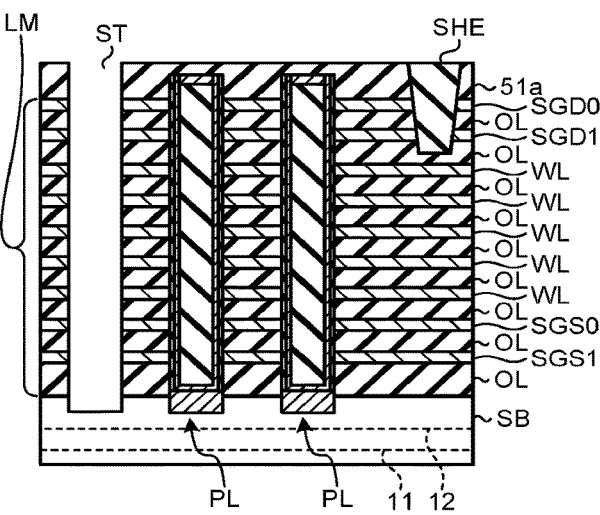

As illustrated in FIG. 2D, the sacrificial layer NL included in the stacked body LMs is replaced with a conductive material to form the word line WL and the select gate lines SGD0, SGD1, SGS0, and SGS1.

That is, the sacrificial layer NL in the stacked body LMs is removed through the slit ST penetrating the stacked body LMs. In addition, a gap between the insulating layers OL formed by removing the sacrificial layer NL is filled with a conductive material through the slit ST. As a result, the stacked body LM including the word line WL and the select gate lines SGD0, SGD1, SGS0, and SGS1 is formed.

Note that a process of replacing the sacrificial layer NL of the stacked body LMs with the word line WL or the like is called a replacement process.

In addition, the $n^+$ diffusion region 13 is formed on the substrate SB exposed on a bottom surface of the slit ST.

Figure 3A:
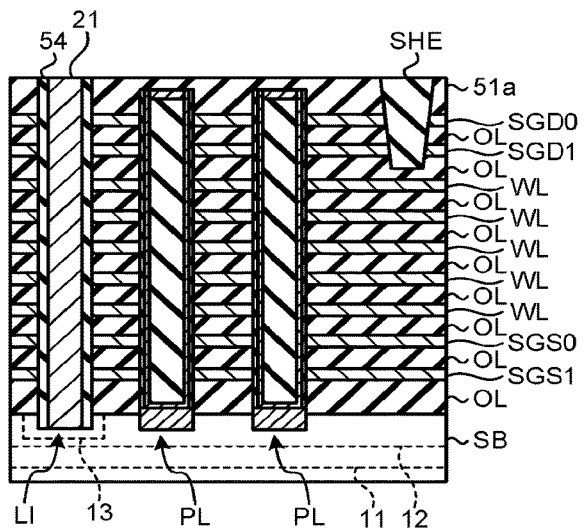
FIGS. 3A to 3D are cross-sectional views illustrating the example of the procedure of the method for manufacturing the semiconductor storage device according to the embodiment.

As illustrated in FIG. 3A, the insulating layer 54 is formed on a side wall of the slit ST, and the inner side of the insulating layer 54 is filled with the conductive layer 21 to form the contact LI. However, the inside of the slit ST may be completely filled with an insulating layer or the like so as not to function as a source line contact.

Figure 3B:
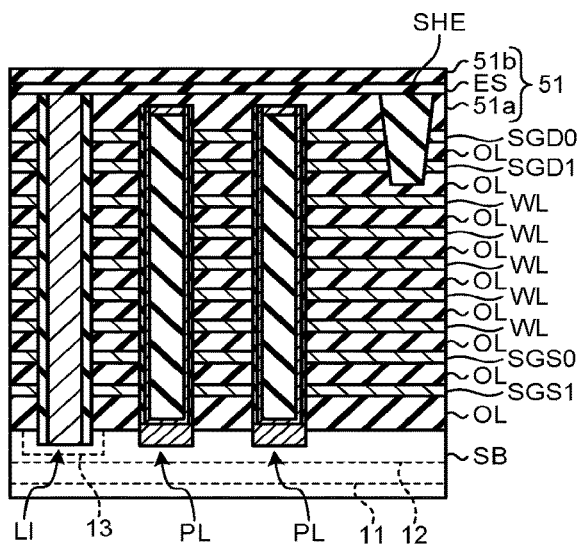

As illustrated in FIG. 3B, the etching stopper layer ES is formed on the insulating layer 51a, and the insulating layer 51b is formed on the etching stopper layer ES.

Figure 3C:
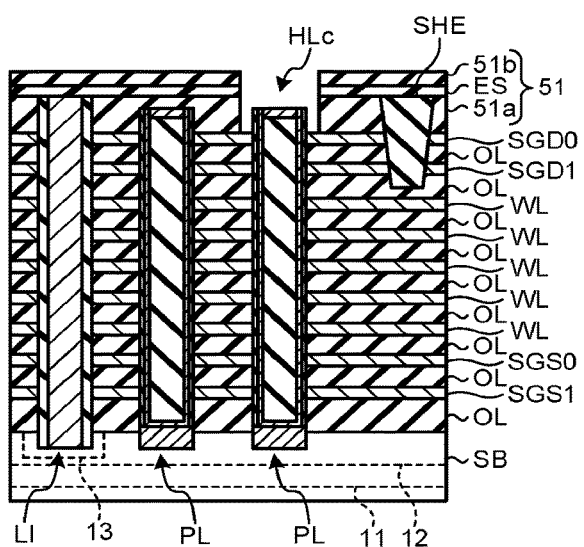

As illustrated in FIG. 3C, a hole HLc, which penetrates the insulating layer 51b and the etching stopper layer ES and reaches a position deeper than the upper surface of the pillar PL in the insulating layer 51a, is formed above the pillar PL. A bottom surface of the hole HLc may reach, for example, an upper surface of the select gate line SGD0.

Figure 3D:
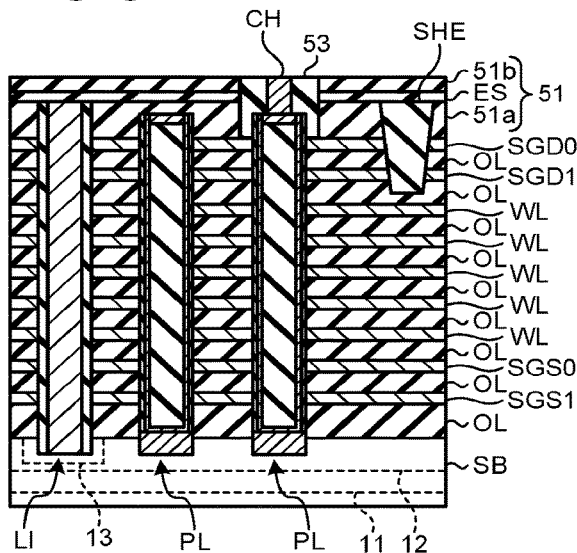

As illustrated in FIG. 3D, the insulating layer 53 is formed on a side wall of the hole HLc, and the inner side of the insulating layer 53 is filled with a conductive layer to form the plug CH connected to the cap layer CP of the pillar PL.

Thereafter, the insulating layer 52 is formed on the insulating layer 51b, and the plug V1 connected to the plug CH is formed in the insulating layer 52. The bit line BL connected to the plug V1 is formed on the insulating layer 52.

In addition, the contact LI is connected to the upper layer wiring by a plug or the like (not illustrated), and the stepped region (not illustrated) of the stacked body LM and the peripheral circuit (not illustrated) on the substrate SB are connected.

As described above, the semiconductor storage device 1 of the embodiment is manufactured.

Here, a method for forming the plug CH and the insulating layer 53 will be described in more detail with reference to FIGS. 4A to 7D. FIGS. 4A to 5B and 7A to 7D are enlarged cross-sectional views illustrating an example of a procedure of the method for forming the plug CH of the semiconductor storage device 1 according to the embodiment. FIGS. 6A and 6B are schematic views illustrating the alignment of the pillar PL and the plug CH of the semiconductor storage device 1 according to the embodiment.

Figure 4A:
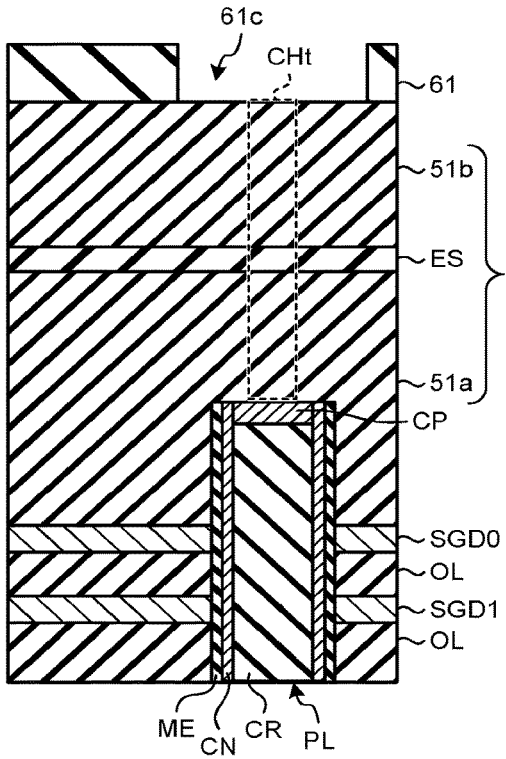
FIGS. 4A to 4D are enlarged cross-sectional views illustrating an example of a procedure of a method for forming a plug of the semiconductor storage device according to the embodiment.

As illustrated in FIG. 4A, the etching stopper layer ES and the insulating layer 51b are formed on the stacked body LM after the replacement process, and then, a mask pattern 61 is formed on the insulating layer 51b. The mask pattern 61 has an opening 61c above the pillar PL. Note that FIG. 4A illustrates a plug position CHt at which the plug CH is to be formed later by a broken line. The opening 61c of the mask pattern 61 has a shape such as a circle in a top view, and has a diameter/circular opening area larger than, for example, a diameter/circular cross-sectional area of the plug CH to be formed and a diameter/circular cross-sectional area of the upper end portion of the pillar PL to be connected. Note that "in a top view" means a case of being viewed from the stacking direction of the stacked body LM.

Figure 4B:
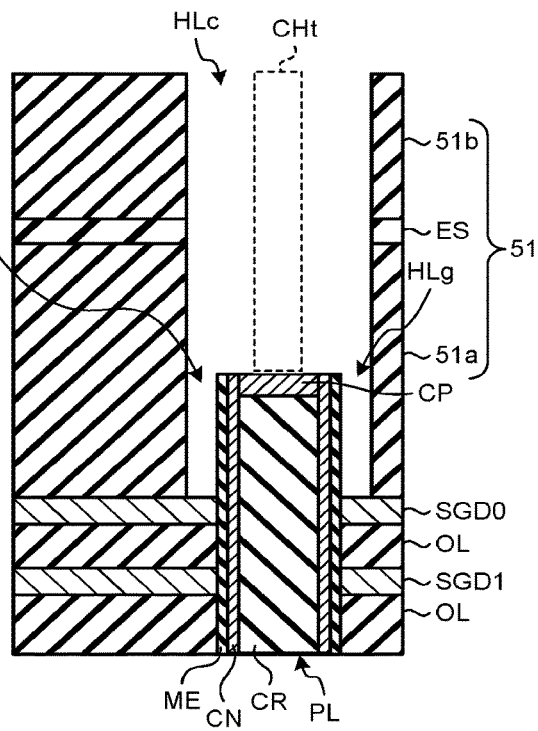

As illustrated in FIG. 4B, the insulating layers 51a and 51b and the etching stopper layer ES are etched using the mask pattern 61 as a mask to form the hole HLc which reaches the upper surface of the pillar PL and has a diameter/opening area larger than the diameter/cross-sectional area of the plug CH and the diameter/cross-sectional area of the pillar PL.

Note that there is a case where a height of the upper end portion of the pillar PL protruding from the select gate line SGD0 into the insulating layer 51a and a difference in height between the pillar PL and the contact LI vary so that a distance from the upper surface of the insulating layer 51b to the upper surface of the pillar PL varies in a manufacturing process of the semiconductor storage device 1.

Therefore, when the hole HLc is formed by etching, it is desirable that the insulating layer 51b be penetrated under an etching condition having a high selectivity with respect to the etching stopper layer ES such that an reaching position of the hole HLc is once aligned on the upper surface of the etching stopper layer ES. In addition, when the insulating layer 51a is etched after the etching stopper layer ES is penetrated under a different etching condition, it is desirable that the etching time be set such that a predetermined over-etching amount is added to a theoretical etching amount until the bottom of the hole HLc reaches the upper surface of the pillar PL.

As a result, the holes HLc formed on the plurality of pillars PL, respectively, can be made to more reliably reach the upper surfaces of the respective pillars PL. As a result, a part of the bottom of the hole HLc coming off the upper surface of the pillar PL reaches a deeper position in the insulating layer 51a than the upper surface of the pillar PL at some or all of the pillars PL. At some or all of the pillars PL, a state may be formed in which the bottom of the hole HLc reaches the upper surface of the select gate line SGD0, and the upper surface of the select gate line SGD0 is exposed at the bottom of the hole HLc.

By such an etching process, the upper end portion of the pillar PL protruding into the insulating layer 51a protrudes into the hole HLc, and a gap portion HLg is formed between the pillar PL and the insulating layer 51a in the outer peripheral portion of the pillar PL. In principle, regarding the entire diameter of the hole HLc in a predetermined cross section of the hole HLc, a total width of the gap portion HLg on both sides of the pillar PL is about a difference between the diameter of the hole HLc and the diameter of the pillar PL.

Figure 4C:
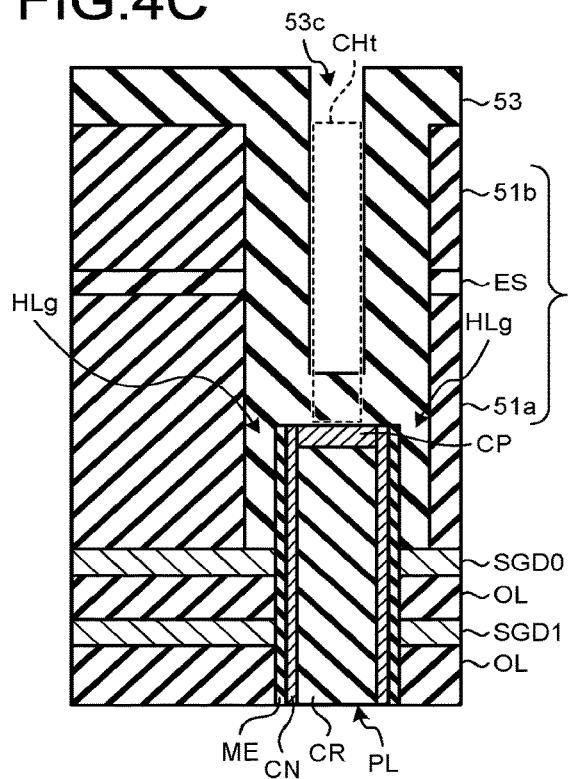

As illustrated in FIG. 4C, the insulating layer 53 is formed on the side wall of the hole HLc. The insulating layer 53 is also formed on the upper surface of the pillar PL and the upper surface of the insulating layer 51b. At this time, a thickness of the insulating layer 53 is adjusted such that the hole HLc is not completely filled and a hole 53c, which is a space to form the plug CH, remains.

In addition, it is preferable that the insulating layer 53 be adjusted to have a thickness such that the gap portion HLg on the outer periphery of the pillar PL is substantially completely filled with the insulating layer 53. In the gap portion HLg, the insulating layer 53 is formed from both the side wall of the pillar PL and the side wall of the insulating layer 51a. Thus, the gap portion HLg can be almost completely filled if the insulating layer 53 is formed to have a thickness of ½ or more of the difference between the diameter of the hole HLc and the diameter of the pillar PL even in consideration of the misalignment between the pillar PL and the plug CH which will be described later.

Here, the area of a region surrounded by the outer edge of the insulating layer 53, that is, the area defined by the outer edge of the insulating layer 53, when viewed from the stacking direction of the stacked body LM, is larger than the cross-sectional area of the plug CH and the area of the upper end portion of the pillar PL.

Note that it is assumed that the outer edge of the insulating layer 53, the plug CH, and the upper end portion of the pillar PL are, for example, circular in the semiconductor storage device 1 of the embodiment. Therefore, since the hole HLc is formed as described in FIG. 4B, the outer edge of the insulating layer 53 also has a diameter larger than the diameter of the plug CH and the diameter of the upper end portion of the pillar PL similarly to the magnitude relationship in the area among the respective configurations.

However, at least any of the outer edge (opening of the hole HLc) of the insulating layer 53, the plug CH, and the upper end portion of the pillar PL may be elliptical or have an oval shape or the like. Even in this case, it is preferable that the area defined by the outer edge of the insulating layer 53 be larger than the cross-sectional area of the plug CH and the area of the upper end portion of the pillar PL as viewed from the stacking direction of the stacked body LM such that the outer edge of the insulating layer 53 can surround the plug CH and the upper end portion of the pillar PL.

Figure 4D:
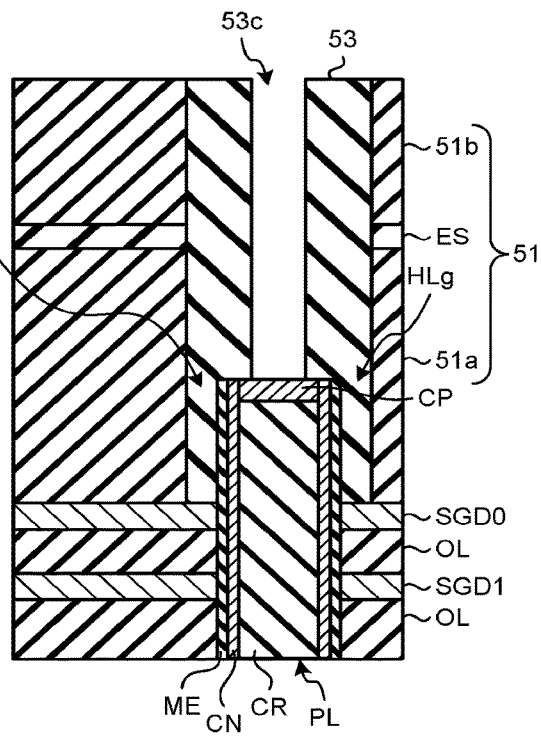

As illustrated in FIG. 4D, the insulating layer 53 on the upper surface of the pillar PL and the upper surface of the insulating layer 51b is removed by etch-back.

Figure 5A:
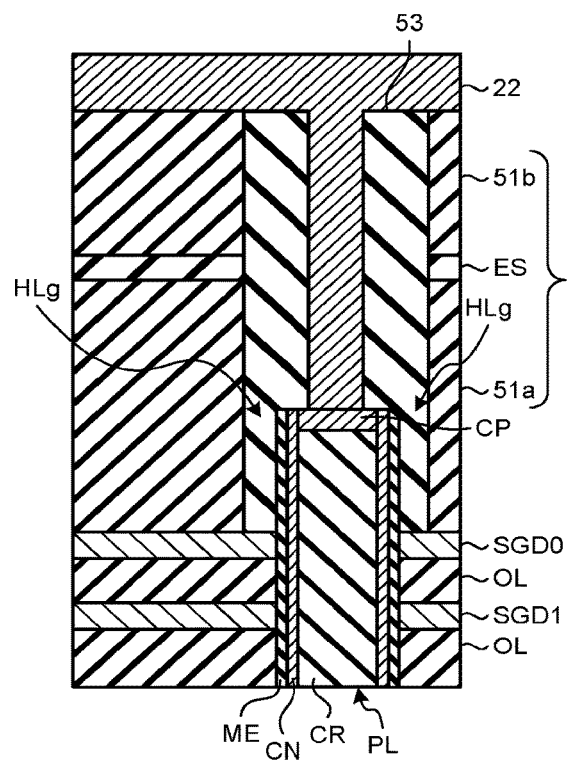
FIGS. 5A and 5B are enlarged cross-sectional views illustrating the example of the procedure of the method for forming the plug of the semiconductor storage device according to the embodiment.
Figure 6A:
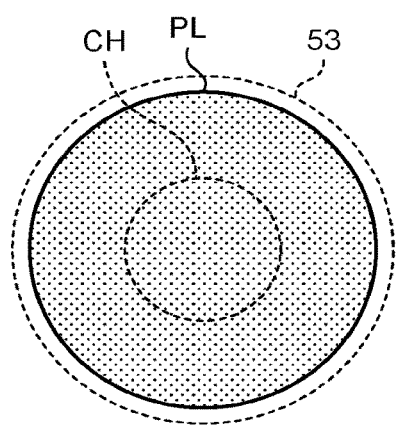
FIGS. 6A and 6B are schematic views illustrating the alignment of a pillar and the plug of the semiconductor storage device according to the embodiment.
Figure 6B:
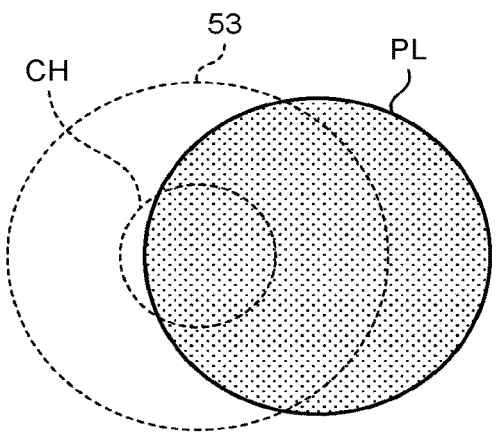

As illustrated in FIG. 5A, the inside of the hole 53c is filled with a conductive layer 22 such as a tungsten layer. The conductive layer 22 is also formed on the upper surface of the insulating layer 51b.

Figure 5B:
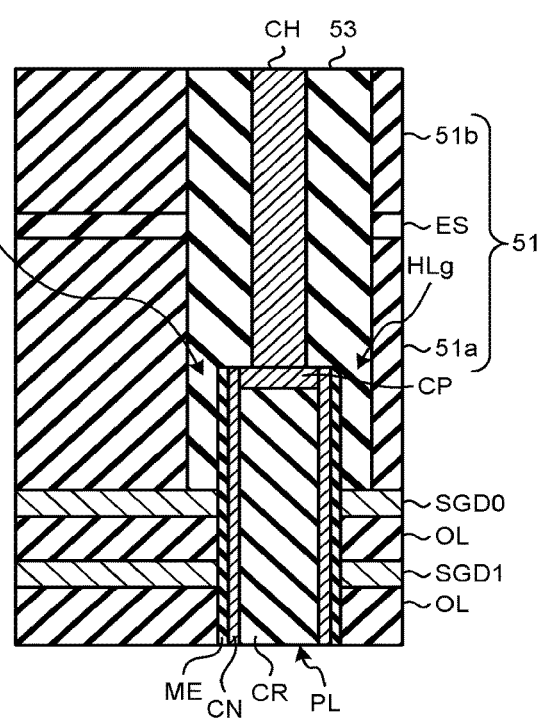

As illustrated in FIG. 5B, the conductive layer 22 on the upper surface of the insulating layer 51b is removed by chemical mechanical polishing (CMP) or the like.

As described above, the plug CH connected to the cap layer CP of the pillar PL is formed. In addition, the insulating layer 53 that surrounds the periphery of the plug CH and ideally surrounds the periphery of the upper end portion of the pillar PL is formed.

However, there is also a case where the plug CH and the insulating layer 53 are formed in a state where the positional relationship between the pillar PL, and each of the plug CH and the insulating layer 53 is different from that in the above examples of FIGS. 4A to 5B. This is because there is a case where the opening 61c is displaced from an arrangement position of the pillar PL depending on the alignment accuracy of photolithography when the mask pattern 61 having the opening 61c is formed.

FIG. 6A illustrates the positional relationship between the pillar PL, and each of the plug CH and the insulating layer 53 when there is no misalignment of the opening 61c with respect to the pillar PL. In this case, the outer edges of the pillar PL, the plug CH, and the insulating layer 53 are arranged so as to be concentric with each other. Therefore, the periphery of the plug CH and the periphery of the pillar PL are surrounded by the insulating layer 53 as in the above examples of FIGS. 4A to 5B.

However, at least any of the outer edge of the insulating layer 53, the plug CH, and the upper end portion of the pillar PL may have a shape other than the circle as described above. Even in this case, if there is no misalignment of the opening 61c with respect to the pillar PL, the periphery of the plug CH and the periphery of the pillar PL are surrounded by the outer edge of the insulating layer 53 which has the same center as the plug CH and the upper end portion of the pillar PL.

FIG. 6B illustrates the positional relationship between the pillar PL, and each of the plug CH and the insulating layer 53 when the opening 61c is misaligned with respect to the pillar PL. Even in this case, the outer edges of the plug CH and the insulating layer 53 are concentric with each other, in principle. However, the plug CH and the insulating layer 53 are arranged to be biased to one side of the pillar PL. Therefore, for example, only the outer periphery of one side of the pillar PL is covered with the insulating layer 53, and the insulating layer 53 is not formed on the outer periphery of the other side of the pillar PL. In addition, for example, a state where a part of the plug CH comes off the upper surface of the pillar PL is formed.

FIGS. 7A to 7D illustrate an example in which the plug CH and the insulating layer 53 are formed in the positional relationship as illustrated in FIG. 6B.

For example, since the mask pattern 61 described above is misaligned as illustrated in FIG. 7A, the hole HLc is formed in a state where an axial center of the hole HLc is deviated from an axial center of the pillar PL. As a result, the gap portion HLg is formed only on one side of the pillar PL in the cross section illustrated in FIG. 7A.

The maximum width of the gap portion HLg at this time is considered to fall within about the difference between the diameter of the hole HLc and the diameter of the pillar PL, for example, from the positioning accuracy of the mask pattern 61. That is, most of a lower surface of the plug position CHt at which the plug CH is to be formed later is maintained on the upper surface of the pillar PL.

Figure 7A:
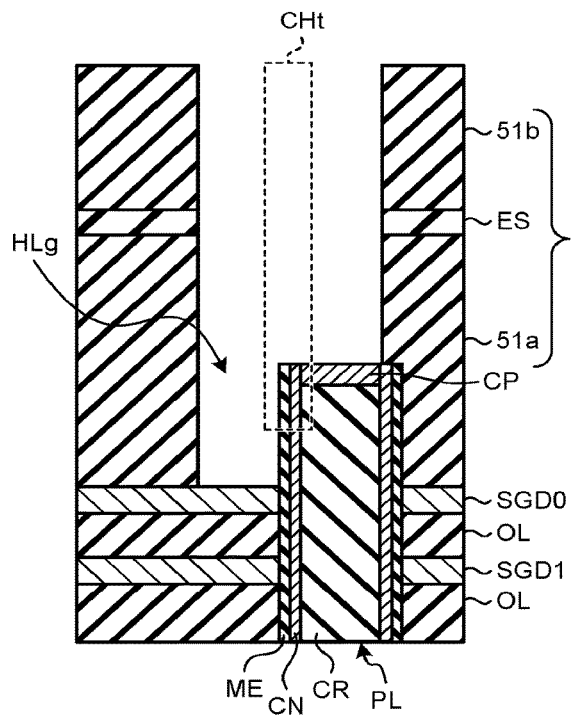
FIGS. 7A to 7D are enlarged cross-sectional views illustrating the example of the procedure of the method for forming the plug of the semiconductor storage device according to the embodiment.
Figure 7B:
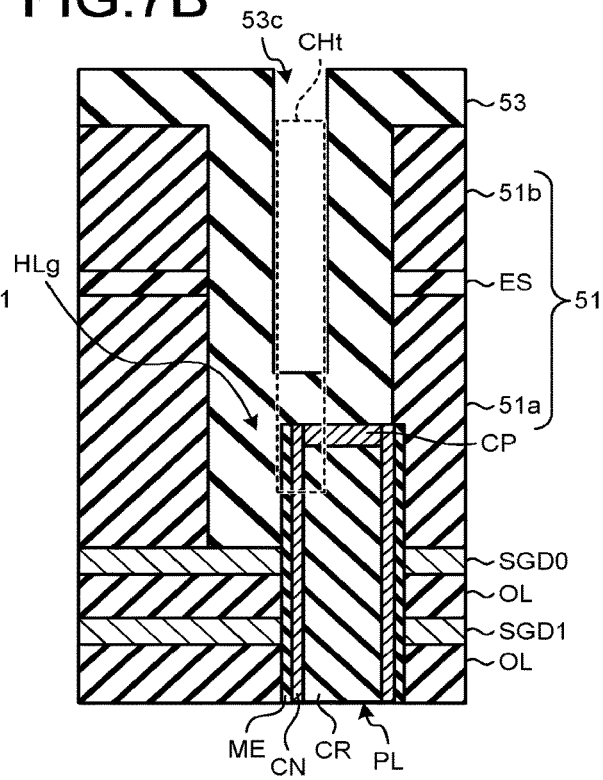

As illustrated in FIG. 7B, the insulating layer 53 is formed on the side wall of the hole HLc such that the hole 53c that serves as a space for forming the plug CH remains. The insulating layer 53 is also formed on the upper surface of the pillar PL and the upper surface of the insulating layer 51b. In addition, if the maximum width of the gap portion HLg is, for example, about twice or less a layer thickness of the insulating layer 53, the gap portion HLg can be completely filled. The above condition is usually satisfied from the alignment accuracy of the mask pattern 61, and the gap portion HLg is almost completely filled with the insulating layer 53.

Figure 7C:
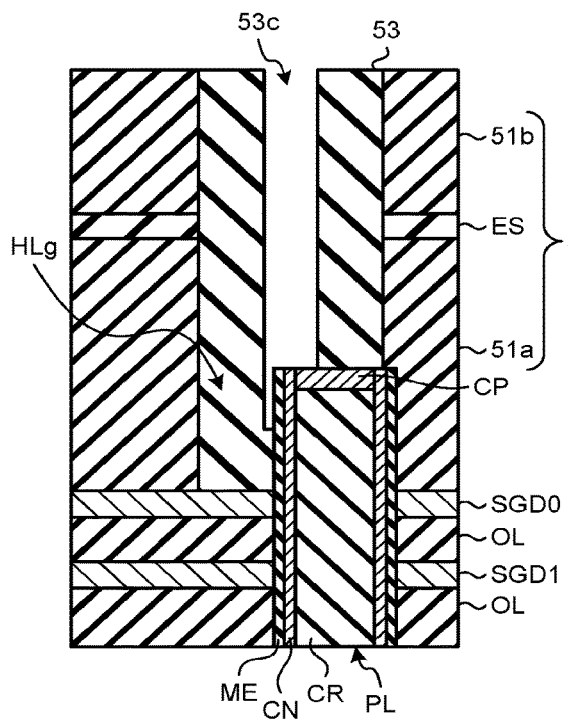

As illustrated in FIG. 7C, the insulating layer 53 on the upper surface of the pillar PL and the upper surface of the insulating layer 51b is removed by etch-back. At this time, a part of the lower surface of the hole 53c coming off the upper surface of the pillar PL is over-etched along the side wall of the pillar PL to reach a predetermined depth of the insulating layer 53 in the gap portion HLg. However, the thickness of the insulating layer 53 with which the gap portion HLg is filled is sufficiently thicker than the amount of over-etching to remove the insulating layer 53 on the upper surface of the pillar PL, and thus, the lower surface of the hole 53c is prevented from penetrating the insulating layer 53 in the gap portion HLg and reaching, for example, the select gate line SGD0.

Figure 7D:
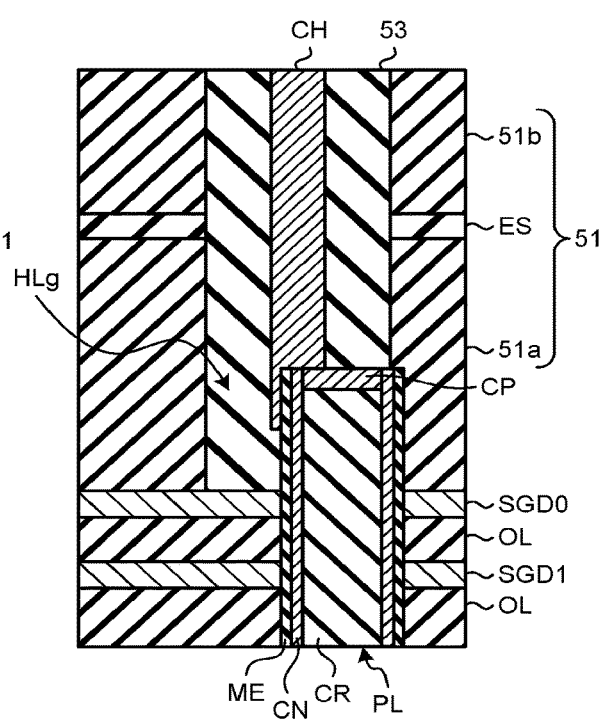

As illustrated in FIG. 7D, the inside of the hole 53c is filled with the conductive layer 22 such as a tungsten layer, and the conductive layer 22 formed on the upper surface of the insulating layer 51b is removed to form the plug CH connected to the upper surface of the pillar PL. A part of a lower end portion of the plug CH comes off the upper surface of the pillar PL and reaches a position deeper than the upper surface of the pillar PL in the insulating layer 53, but is prevented from coming into contact with the select gate line SGD0.

As a result, even if the pillar PL, and each of the plug CH and the insulating layer 53 are displaced within the range of the alignment accuracy of photolithography, the plug CH to be connected to the cap layer CP of the pillar PL is formed while preventing the contact with the select gate line SGD0. In addition, the insulating layer 53, which surrounds the periphery of the plug CH and covers at least a part of the outer periphery of the upper end portion of the pillar PL, is formed. At this time, if the amount of misalignment between the pillar PL and the plug CH is large, the lower end portion of a part of the plug CH is interposed between the insulating layer 53 covering a part of the outer periphery of the upper end portion of the pillar PL and the pillar PL.

Meanwhile, it is desired that some conditions be satisfied for the layer thickness of the insulating layer 53 formed on the side wall of the hole HLc. The conditions desired for the layer thickness of the insulating layer 53 will be described hereinafter with reference to FIGS. 8A to 8D.

Figure 8D:
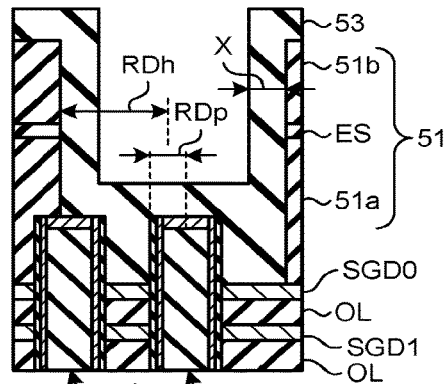
FIGS. 8A to 8D are views illustrating the relationship between a layer thickness of an insulating layer, and a hole diameter and a pillar diameter of the semiconductor storage device according to the embodiment.
Figure 8A:
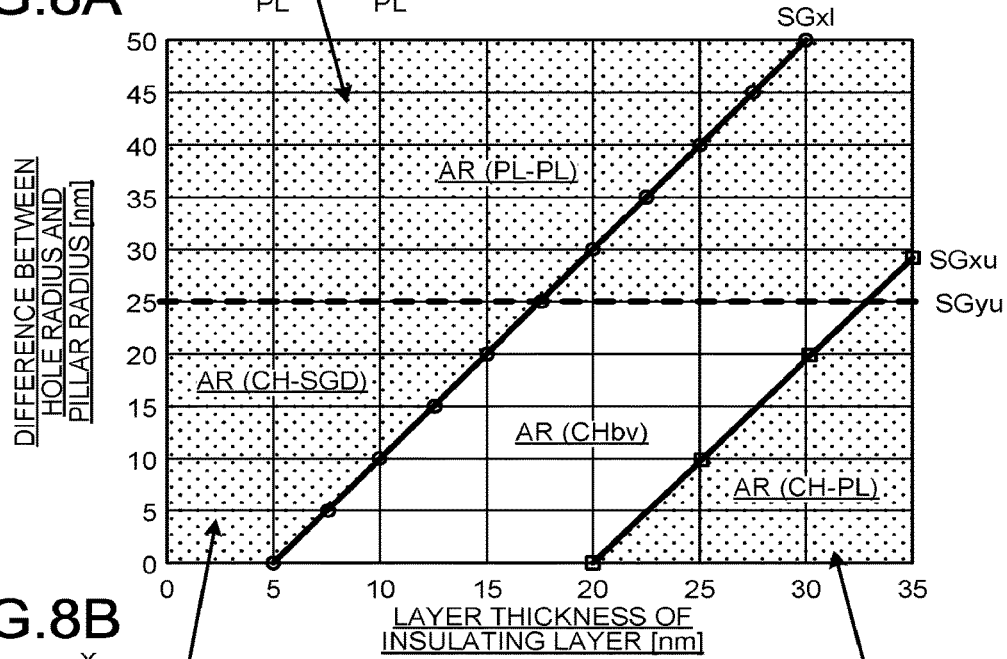

FIGS. 8A to 8D are views illustrating the relationship between the layer thickness of the insulating layer 53, and each of the diameter of the hole HLc and the diameter of the pillar PL of the semiconductor storage device 1 according to the embodiment. The horizontal axis of a graph in FIG. 8A represents a layer thickness X (nm) of the insulating layer 53. The vertical axis of the graph of FIG. 8A represents a difference Y (nm) between a radius RDh of the bottom surface of the hole HLc and a radius RDp of the upper end portion of the pillar PL that is obtained by subtracting a radius RDp of the upper end portion of the pillar PL from a radius RDh of the bottom surface of the hole HLc. In other words, the vertical axis of the graph of FIG. 8A represents ½ of a difference between a diameter of the bottom surface of the hole HLc and a diameter of the upper end portion of the pillar PL.

Note that the radius RDh of the bottom surface of the hole HLc can be considered to be the same as a radius of a lower end of the outer edge of the insulating layer 53. That is, the difference Y (nm) between the radius RDh of the bottom surface of the hole HLc and the radius RDp of the upper end portion of the pillar PL can be rephrased as the difference Y (nm) between the radius of the lower end of the outer edge of the insulating layer 53 and the radius RDp of the upper end portion of the pillar PL.

A line segment SGx1 indicates a lower limit of the layer thickness X of the insulating layer 53, and is expressed by, for example, the following Formula (1).

$$Y=2X-10 \quad (1)$$

Figure 8B:
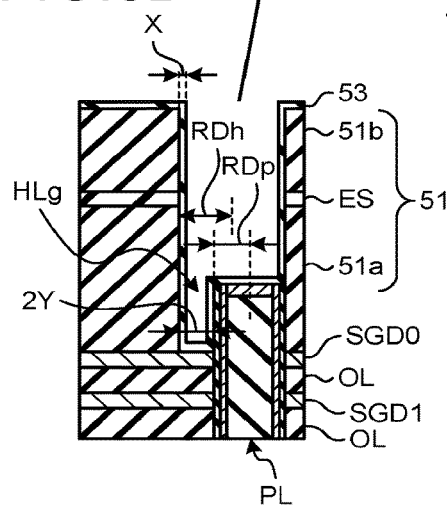

That is, it is desirable that the layer thickness X (nm) of the insulating layer 53 not be a value in a region AR (CH-SGD) above the line segment SGx1 in the graph of FIG. 8A. Specifically, as illustrated in FIG. 8B, there is a possibility that the gap portion HLg is not sufficiently filled with the insulating layer 53 in the region AR (CH-SGD). That is, when considering the misalignment that is likely to occur between the pillar PL, and each of the plug CH and the insulating layer 53, there is a possibility that the maximum width of the gap portion HLg is larger than double of the layer thickness of the insulating layer 53. If the gap portion HLg is not sufficiently filled with the insulating layer 53, there may occur a case where the insulating layer 53 is also removed from the bottom surface of the gap portion HLg at the time of removing the insulating layer 53 from the upper surface of the pillar PL so that, for example, the select gate line SGD0 is exposed inside the gap portion HLg. Therefore, if the conductive layer 22 of the plug CH is filled, the contact with the select gate line SGD0 occurs, so that there is a possibility that a short circuit occurs between the plug CH and the select gate line SGD0.

In this manner, the amount of misalignment that may occur between the pillar PL, and each of the plug CH and the insulating layer 53 is added to Formula (1), and a y-intercept value (−10) in Formula (1) depends, for example, on the alignment accuracy of the mask pattern 61.

A line segment SGxu indicates an upper limit of the layer thickness X of the insulating layer 53, and is expressed by, for example, the following Formula (2).

$$Y=2X-40 \quad (2)$$

Figure 8C:
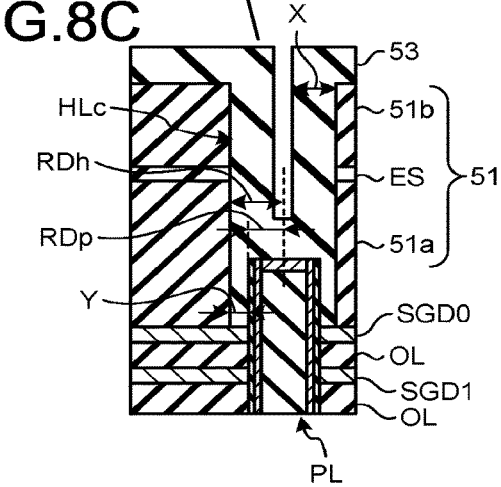

That is, it is desirable that the layer thickness X (nm) of the insulating layer 53 not be a value in a region AR (CH-PL) below the line segment SGxu in the graph of FIG. 8A. Specifically, as illustrated in FIG. 8C, there is a possibility that the inside of the hole HLc is blocked by the insulating layer 53 to such an extent that it is difficult to sufficiently secure the diameter of the plug CH, in the region AR (CH-PL). If it is difficult to sufficiently secure the diameter of the plug CH, there is a possibility that conduction between the plug CH and the pillar PL is not obtained, or a resistance value increases.

In this manner, a target value or a design value of the diameter of the plug CH has been added to Formula (2), and a y-intercept value (−40) of Formula (2) depends on, for example, the diameter of the plug CH.

A line segment SGyu indicates an upper limit of the difference Y between the radius RDh of the bottom surface of the hole HLc and the radius RDp of the upper end portion of the pillar PL, and is expressed by, for example, the following Formula (3).

$$Y=25 \text{ nm} \quad (3)$$

It is desirable that the difference Y between the radius RDh of the bottom surface of the hole HLc and the radius RDp of the upper end portion of the pillar PL not be a value in a region AR (PL-PL) above the line segment SGyu in the graph of FIG. 8A.

The above Formula (3) represents a condition based on the fact that the plurality of pillars PL are arranged to be separated by a predetermined distance. Specifically, as illustrated in FIG. 8D, there is a possibility that the plug CH comes too close to the pillar PL adjacent to the pillar PL to which the plug CH is connected, or the lower end portion of the plug CH comes into contact with the adjacent pillar PL, in the region AR (PL-PL). If the adjacent pillar PL and the plug CH are too close to each other, there is a possibility that a short circuit or a leakage current occurs between the adjacent pillar PL and the plug CH.

In this manner, a design value of the distance between the respective pillars PL has been added to Formula (3), and an upper limit value (25) of the difference Y between the radius RDh of the bottom surface of the hole HLc and the radius RDp of the upper end portion of the pillar PL in Formula (3) depends on, for example, the distance between the pillars PL.

As described above, the desirable layer thickness of the insulating layer 53 is within a range satisfying the following Formula (4) in the example illustrated in the graph of FIG. 8A.

$$2X-40 \leq Y \leq 2X-10 \text{ and } 0 \text{ nm} < Y < 25 \text{ nm} \quad (4)$$

That is, the desirable layer thickness of the insulating layer 53 is a value in a region AR (CHbv) surrounded by the line segments SGx1, SGxu, and SGyu obtained by Formulas (1) to (3).

In other words, the desired layer thickness of the insulating layer 53 has a lower limit value determined by the maximum width that the gap portion HLg can take depending on the alignment accuracy of the mask pattern 61, and an upper limit value determined by the diameter of the plug CH and the diameter of the hole HLc, and further, is also affected by the distance between the pillars PL. As described above, since both the pillar PL and the plug CH have the columnar shape, there occurs a desirable condition as represented by Formula (4) with respect to the layer thickness of the insulating layer 53.

In a semiconductor storage device such as a three-dimensional non-volatile memory, for example, a plurality of pillars are formed to penetrate a stacked body in which word lines and the like are stacked, and memory cells are formed at intersections with the word lines. Upper surfaces of these pillars are connected to an upper layer wiring such as a bit line via a plug. Since the pillar and the plug both having a columnar shape are connected, high alignment accuracy is desired for the pillar and the plug.

According to the semiconductor storage device 1 of the embodiment, the plug CH extending in the vertical direction inside the insulating layers 51a and 51b, and the insulating layer 53 surrounding the periphery of the plug CH and having a lower dielectric constant than those of the insulating layers 51a and 51b are provided. That is, the hole HLc having a larger diameter than the plug CH is formed, and the plug CH is formed after forming the insulating layer 53 inside the hole HLc so as to surround the plug position CHt at which the plug CH is to be formed later.

As a result, the contact between the plug CH on the upper layer of the pillar PL and the select gate line SGD0 can be prevented. In other words, even if a part of the lower end portion of the plug CH comes off the upper surface of the pillar PL due to the misalignment between the pillar PL and the plug CH, the insulating layer 53 is interposed between the lower end portion of the plug CH and the select gate line SGD0. Accordingly, it is possible to prevent the plug CH and the select gate line SGD0 from coming into contact with each other and causing the short circuit.

In addition, since the insulating layer 53 having a low dielectric constant surrounds the periphery of the plug CH, it is possible to reduce a parasitic capacitance that may occur in the periphery of the plug CH.

According to the semiconductor storage device 1 of the embodiment, the diameter of the outer edge of the insulating layer 53 is larger than the diameter of the upper end portion of the pillar PL, and the insulating layer 53 covers at least a part of the outer periphery of the upper end portion of the pillar PL. In this manner, it becomes easy to secure the diameter of the hole 53c for forming the plug CH after formation of the insulating layer 53 by increasing the diameter of the outer edge of the insulating layer 53.

In addition, if the amount of misalignment between the pillar PL and the plug CH is sufficiently small, the entire outer periphery of the upper end portion of the pillar PL is covered with the insulating layer 53. In addition, even if the pillar PL and the plug CH are misaligned, at least a part of the outer periphery of the upper end portion of the pillar PL is covered with the insulating layer 53. Therefore, a withstand voltage between the adjacent pillars PL can be improved.

According to the semiconductor storage device 1 of the embodiment, in the vertical direction inside the insulating layer 51, that is, at a predetermined position in the stacking direction of the stacked body LM, the etching stopper layer ES, which is inserted between the insulating layers 51a and 51b and surrounds the periphery of the plug CH with the insulating layer 53 interposed therebetween at this vertical position, is provided. Since the insulating layer 53 having a low dielectric constant is interposed between the etching stopper layer ES having a high dielectric constant and the plug CH, it is possible to further reduce the parasitic capacitance that may occur in the periphery of the plug CH.

Note that the predetermined position in the insulating layer 51 into which the etching stopper layer ES is inserted can be arbitrarily determined in view of the above-described role of the etching stopper layer ES that the position of the bottom surface of the hole HLc during etching is once aligned. Specifically, for example, any position above the upper end portion of the pillar PL located inside the insulating layer 51 can be set as the predetermined position into which the etching stopper layer ES is inserted.

According to the semiconductor storage device 1 of the embodiment, the layer thickness of the insulating layer 53 has a desirable lower limit value derived from the maximum width that can occur between the outer edge of the insulating layer 53 and the outer periphery of the pillar PL, for example, depending on the misalignment accuracy between the pillar PL and the plug CH. Since the layer thickness of the insulating layer 53 is determined based on such a lower limit value, the gap portion HLg can be more reliably filled with the insulating layer 53, and the short circuit between the plug CH and the select gate line SGD0 can be prevented.

According to the semiconductor storage device 1 of the embodiment, the layer thickness of the insulating layer 53 has a desirable upper limit value determined by, for example, the diameter of the plug CH and the diameter of the outer edge of the insulating layer 53. Since the layer thickness of the insulating layer 53 is determined based on such an upper limit value, it is possible to secure the diameter of the hole 53c for forming the plug CH after the inside of the hole HLc is lined with the insulating layer 53.

According to the semiconductor storage device 1 of the embodiment, a desired layer thickness of the insulating layer 53 is also affected, for example, by the distance between the pillars PL. Since the layer thickness of the insulating layer 53 is determined in consideration of this influence, for example, it is possible to prevent the plug CH from being too close to the pillar PL adjacent to the pillar PL to which the plug is connected.

Note that the diameter of the outer edge of the insulating layer 53 is larger than the diameter of the pillar PL in the above-described embodiment. However, the diameter of the outer edge of the insulating layer 53 may be substantially equal to the diameter of the pillar PL, or may be smaller than the diameter of the pillar PL. Even with such a configuration, the short circuit between the plug CH and the select gate line SGD0 can be prevented. In addition, when the amount of misalignment between the pillar PL and the plug CH is sufficiently small, an outer peripheral portion of the upper end portion of the pillar PL is not covered with the insulating layer 53, but the periphery of the plug CH is surrounded by the insulating layer 53, so that the parasitic capacitance in the periphery of the plug CH is reduced.

In addition, the insulating layer 53 is the low-k layer having a lower dielectric constant than those of the insulating layers 51a and 51b in the above-described embodiment. However, the insulating layer 53 may be a layer having a dielectric constant similar to those of the insulating layers 51a and 51b, and may be, for example, an SiO$_2$ layer, a SiON layer, or the like which is the same type as the insulating layers 51a and 51b. Even with such a configuration, the short circuit between the plug CH and the select gate line SGD0 can be prevented.

(Modification)

Next, a semiconductor storage device of a modification of the embodiment will be described with reference to FIGS. 9A and 9D. The semiconductor storage device of the modification does not have an etching stopper layer, which is different from the above-described embodiment.

Figure 9A:
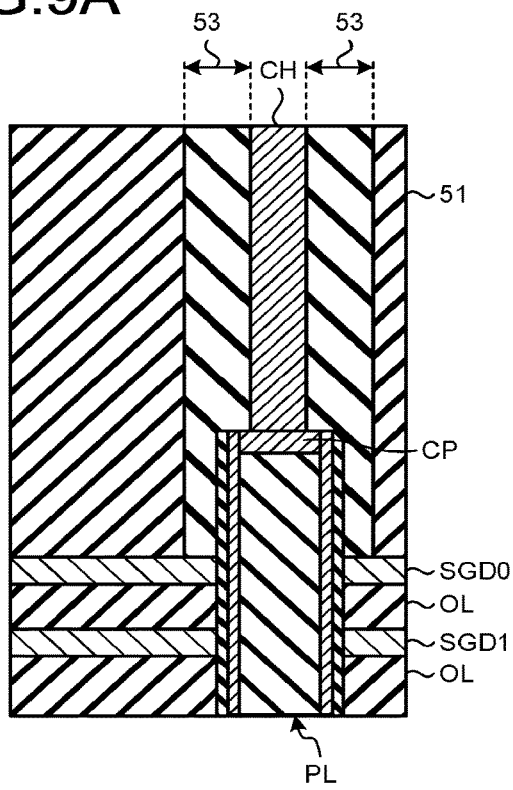
FIGS. 9A to 9D are enlarged cross-sectional views illustrating a configuration example of the vicinity of a plug of a semiconductor storage device according to a modification of the embodiment.
Figure 9B:
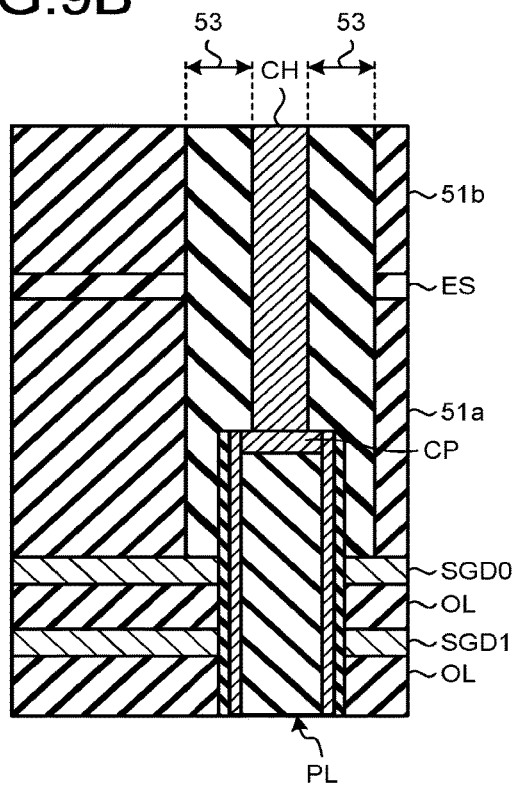
Figure 9C:
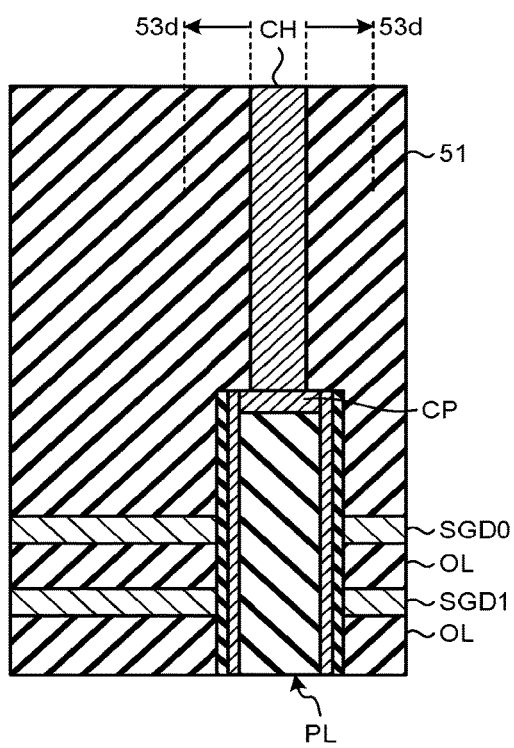
Figure 9D:
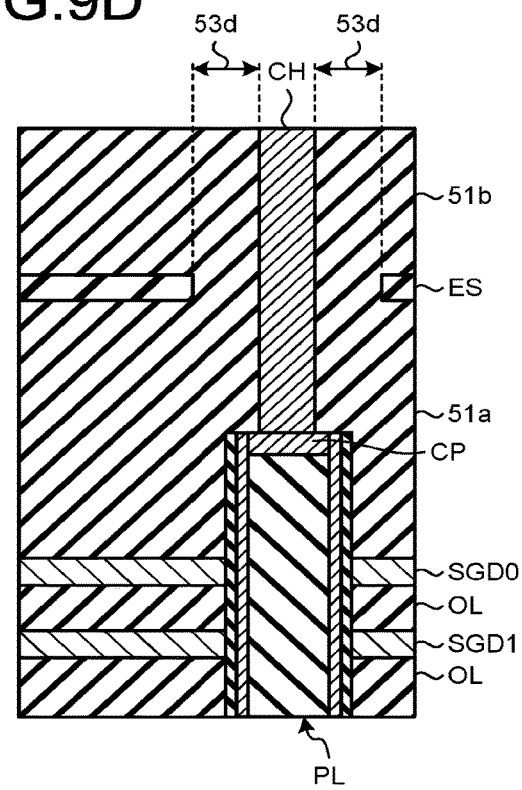

FIGS. 9A to 9D are enlarged cross-sectional views illustrating a configuration example of the vicinity of the plug CH of the semiconductor storage device according to the modification of the embodiment. FIG. 9A illustrates an example in which the insulating layer 53 surrounds the periphery of the plug CH similarly to the above-described embodiment. For comparison, FIG. 9B illustrates an example in which the etching stopper layer ES is provided between the insulating layers 51a and 51b, and the insulating layer 53 surrounds the periphery of the plug CH similarly to the above-described embodiment. FIG. 9C illustrates an example in which an insulating layer 53d such as an SiO$_2$ layer surrounds the periphery of the plug CH. For comparison, FIG. 9D illustrates an example in which the etching stopper layer ES is provided between the insulating layers 51a and 51b, and the insulating layer 53d surrounds the periphery of the plug CH.

As will be described hereinafter, a technique for preventing a short circuit between the plug CH and the select gate line SGD0 is adopted in the configurations illustrated in FIGS. 9A to 9D, which is similar to the above-described embodiment. Therefore, it is unnecessary to strictly align etching depths of holes for forming the plug CH, and the configuration having no etching stopper layer can be adopted, for example, as illustrated in FIGS. 9A and 9C.

As illustrated in FIG. 9A, the etching stopper layer is not arranged inside the insulating layer 51, which is an upper layer of the select gate line SGD0, as an example of the semiconductor storage device of the modification. The insulating layer 51 as an upper insulating layer has a configuration corresponding to the insulating layers 51a and 51b of the above-described embodiment, and is, for example, an SiO$_2$ layer or the like.

The periphery of the plug CH is surrounded by the insulating layer 53 which is a low-k layer similarly to the above-described embodiment. The insulating layer 53 is a layer whose material type is different from that of the insulating layer 51. Therefore, it is possible to discriminate that a layer different from the insulating layer 51 surrounds the periphery of the plug CH by certain analysis means. Examples of the analysis means include detection of an interface between the insulating layer 53 and the insulating layer 51, detection of a component different from that of the insulating layer 51 in the periphery of the plug CH, and the like.

Even in the configuration of the above-described embodiment illustrated in FIG. 9B, it is possible to determine that a layer different from the insulating layers 51a and 51b surrounds the periphery of the plug CH by using the same analysis means as in FIG. 9A. In addition, the outer edges of the plug CH and the insulating layer 53 are arranged so as to be substantially concentric with each other as described above. Therefore, the etching stopper layer ES is also arranged so as to surround the periphery of the plug CH substantially concentrically in the configuration of FIG. 9B. This can also be evidence that a layer different from the insulating layers 51a and 51b surrounds the periphery of the plug CH.

In this manner, the periphery of the plug CH is surrounded by a layer different from the insulating layers 51a and 51b in both cases of FIGS. 9A and 9B, and thus, it is presumed that the plug CH has been formed using the above-described technique for preventing the short circuit between the plug CH and the select gate line SGD0.

As illustrated in FIG. 9C, as another example of the semiconductor storage device of the modification, the insulating layer 53d may be arranged around the periphery of the plug CH, instead of the insulating layer 53, in the configuration in which the etching stopper layer is not arranged in the insulating layer 51 of the upper layer of the select gate line SGD0.

The insulating layer 53d is, for example, a layer having a dielectric constant similar to that of the insulating layer 51, and is, for example, an SiO$_2$ layer of the same type as the insulating layer 51. Therefore, there is a case where it is difficult to discriminate that a layer formed separately from the insulating layer 51 surrounds the periphery of the plug CH by certain analysis means.

In the case of including the etching stopper layer ES as illustrated in FIG. 9D, it is possible to discriminate that the periphery of the plug CH is surrounded by a layer formed separately from the insulating layer 51 indirectly by the etching stopper layer ES even if it is difficult to discriminate the insulating layer 53d itself. That is, the etching stopper layer ES is not in contact with the plug CH, and the etching stopper layer ES is arranged so as to be separated from the plug CH and surround the periphery of the plug CH, for example, substantially concentrically. In addition, the etching stopper layer ES results in the separation from the plug CH with substantially the same distance in the entire periphery of the plug CH, and thus, it is possible to discriminate that the layer, which is interposed and separates between the etching stopper layer ES and the plug CH, is formed separately from the insulating layers 51a and 51b with a thickness corresponding to a separation distance therebetween.

In this manner, the periphery of the plug CH is surrounded by a layer different from the insulating layers 51a and 51b at least in FIG. 9D, and thus, it is presumed that the plug CH has been formed using the above-described technique for preventing the short circuit between the plug CH and the select gate line SGD0.

According to the semiconductor storage device of the modification, the plug CH extending in the vertical direction inside the insulating layer 51 and the insulating layer 53 or the insulating layer 53d surrounding the periphery of the plug CH are provided. In this manner, the semiconductor storage device of the modification also uses the technique for preventing the short circuit between the plug CH and the select gate line SGD0, whereby the etching stopper layer in the insulating layer 51 can be eliminated. Accordingly, it is possible to reduce a manufacturing process of the semiconductor storage device of the modification and reduce the cost.

OTHER MODIFICATIONS

In the above-described embodiment and modification, the semiconductor storage device is provided with the stacked body LM including the word line WL and the select gate lines SGD0, SGD1, SGS0, and SGS1 which are metal layers, such as tungsten layers, as conductive layers. However, the conductive layer of the stacked body may be a layer containing a silicon material such as a polysilicon layer or the like. In this case, a stacked body in which layers containing a silicon material are stacked is formed from the beginning, and a semiconductor storage device is manufactured without a replacement process.

In the above-described embodiment and modification, the semiconductor storage device has a one-tier structure including one stacked body LM. However, the semiconductor storage device may have a structure of two tiers or more.

In the above-described embodiment and modification, the semiconductor storage device includes the stacked body LM stacked on the substrate SB, and includes the peripheral circuit arranged on the substrate SB outside the stacked body LM. However, the stacked body LM of the semiconductor storage device may be stacked above the peripheral circuit via a source line such as a polysilicon layer or the like. Alternatively, the peripheral circuit may be arranged above the stacked body LM by forming the stacked body LM and the peripheral circuit on different substrates and attaching these substrates.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a stacked body in which a plurality of conductive layers are separated from each other and are stacked;
   a pillar which extends in a stacking direction of the plurality of conductive layers inside the stacked body and includes memory cells to be formed at intersections with at least some of the plurality of conductive layers;
   an upper insulating layer arranged on the stacked body;
   a plug which extends in the stacking direction inside the upper insulating layer and is connected to an upper end portion of the pillar; and
   a spacer insulating layer which surrounds the plug inside the upper insulating layer and has a lower dielectric constant than a dielectric constant of the upper insulating layer.

2. The semiconductor storage device according to claim 1, wherein
   when viewed from the stacking direction, an area defined by an outer edge of the spacer insulating layer is larger than an area of the upper end portion of the pillar, and the spacer insulating layer covers at least a part of an outer periphery of the upper end portion of the pillar.

3. The semiconductor storage device according to claim 2, wherein
   when a layer thickness of the spacer insulating layer is X nm, and a difference value obtained by subtracting a radius of the upper end portion of the pillar from a radius of a lower end of the outer edge of the spacer insulating layer is Y nm, a following formula is satisfied:

$2X-40 \leq Y \leq 2X-10$.

4. The semiconductor storage device according to claim 3, wherein
   the pillar includes a plurality of pillars arranged to be separated from each other by a predetermined distance, and
   the difference value (Y nm) obtained by subtracting the radius of the upper end portion of the pillar from the radius of the lower end of the outer edge of the spacer insulating layer is larger than 0 nm and smaller than 25 nm.

5. The semiconductor storage device according to claim 1, wherein
   the spacer insulating layer is a low-k layer containing at least one of low-k materials of SiOC, SiOF, SiOCN, SiCOH, SiBCN, hydrogen-containing SiO, and methyl group-containing SiO.

6. The semiconductor storage device according to claim 5, wherein
   the at least one of low-k materials contained in the low-k layer is porous.

7. The semiconductor storage device according to claim 1, wherein
   the upper insulating layer includes an intermediate insulating layer that is inserted at a predetermined position in the upper insulating layer in the stacking direction and surrounds a periphery of the plug interposed by the spacer insulating layer, at the predetermined position in the stacking direction.

8. The semiconductor storage device according to claim 7, wherein
   the intermediate insulating layer surrounds the periphery of the plug substantially concentrically.

9. The semiconductor storage device according to claim 7, wherein
   the intermediate insulating layer has a higher dielectric constant than dielectric constants of other parts of the upper insulating layer.

10. The semiconductor storage device according to claim 1, wherein
    when viewed from the stacking direction, the plug has an area smaller than an area of the upper end portion of the pillar.

11. A semiconductor storage device comprising:
    a stacked body in which a plurality of conductive layers are separated from each other and are stacked;
    a pillar which extends in a stacking direction of the plurality of conductive layers inside the stacked body and includes memory cells to be formed at intersections with at least some of the plurality of conductive layers;
    an upper insulating layer arranged on the stacked body, the upper insulating layer including an intermediate insulating layer made of a different material from other parts of the upper insulating layer at a predetermined position in the stacking direction, the intermediate insulating layer having a higher dielectric constant than dielectric constants of the other parts of the upper insulating layer; and
    a plug which extends in the stacking direction inside the upper insulating layer and is connected to an upper end portion of the pillar, wherein
    the intermediate insulating layer is separated from the plug and surrounds a periphery of the plug at the predetermined position in the stacking direction.

12. The semiconductor storage device according to claim 11, wherein the intermediate insulating layer surrounds the periphery of the plug substantially concentrically.

13. The semiconductor storage device according to claim 11, wherein
the intermediate insulating layer is an SiN layer.

14. A semiconductor storage device comprising:
a stacked body in which a plurality of conductive layers are separated from each other and are stacked;
a pillar which extends in a stacking direction of the plurality of conductive layers inside the stacked body and includes memory cells to be formed at intersections with at least some of the plurality of conductive layers;
an upper insulating layer arranged on the stacked body, the upper insulating layer including an intermediate insulating layer made of a different material from other parts of the upper insulating layer at a predetermined position in the stacking direction;
a plug which extends in the stacking direction inside the upper insulating layer and is connected to an upper end portion of the pillar; and
a spacer insulating layer which surrounds the plug inside the upper insulating layer, has a diameter, defined by an outer edge thereof, being larger than a diameter of the upper end portion of the pillar, and is interposed between the plug and the intermediate insulating layer at the predetermined position in the stacking direction.

15. The semiconductor storage device according to claim 14, wherein
the spacer insulating layer covers at least a part of an outer periphery of the upper end portion of the pillar.

16. The semiconductor storage device according to claim 14, wherein
the spacer insulating layer is a low-k layer containing at least one of low-k materials of SiOC, SiOF, SiOCN, SiCOH, SiBCN, hydrogen-containing SiO, and methyl group-containing SiO.

17. The semiconductor storage device according to claim 16, wherein
the at least one of low-k materials contained in the low-k layer is porous.

18. The semiconductor storage device according to claim 14, wherein
the intermediate insulating layer surrounds a periphery of the plug substantially concentrically.

19. The semiconductor storage device according to claim 14, wherein
when viewed from the stacking direction, the plug has an area smaller than an area of the upper end portion of the pillar.

* * * * *